(12) United States Patent
Kobayashi

(10) Patent No.: US 7,636,906 B2
(45) Date of Patent: Dec. 22, 2009

(54) SEMICONDUCTOR INTEGRATED CIRCUIT AND LAYOUT DESIGNING METHOD OF THE SAME

(75) Inventor: Tsutomu Kobayashi, Shiga (JP)

(73) Assignee: Panasonic Corporation, Osaka (JP)

( * ) Notice: Subject to any disclaimer, the term of this patent is extended or adjusted under 35 U.S.C. 154(b) by 245 days.

(21) Appl. No.: 11/521,490

(22) Filed: Sep. 15, 2006

(65) Prior Publication Data

US 2007/0061770 A1    Mar. 15, 2007

(30) Foreign Application Priority Data

Sep. 15, 2005   (JP) ............................. 2005-268564

(51) Int. Cl.
*G06F 17/50* (2006.01)
(52) U.S. Cl. .............................. 716/11; 716/12; 716/13
(58) Field of Classification Search ................. 716/1–2, 716/8–14
See application file for complete search history.

(56) References Cited

U.S. PATENT DOCUMENTS

| | | | |
|---|---|---|---|
| 6,127,207 A * | 10/2000 | Hongo | 438/123 |
| 6,489,668 B1 * | 12/2002 | Oda et al. | 257/675 |
| 6,745,379 B2 | 6/2004 | Teig et al. | |
| 2002/0133798 A1 | 9/2002 | Teig et al. | |
| 2002/0182844 A1 | 12/2002 | Igarashi et al. | |
| 2003/0079194 A1 | 4/2003 | Igarashi et al. | |
| 2004/0143806 A1 * | 7/2004 | Kodama et al. | 716/5 |
| 2004/0262640 A1 | 12/2004 | Suga | |
| 2005/0023705 A1 * | 2/2005 | Campbell et al. | 716/12 |
| 2005/0273748 A1 * | 12/2005 | Hetzel et al. | 716/14 |
| 2007/0235766 A1 * | 10/2007 | Kojima et al. | 716/2 |

\* cited by examiner

*Primary Examiner*—Paul Dinh
(74) *Attorney, Agent, or Firm*—McDermott Will & Emery LLP

(57) ABSTRACT

A semiconductor integrated circuit of the present invention comprises a hard macro and a plurality of wirings connected to the hard macro. The hard macro comprises a hard macro main body, and a plurality of pins with a minimum pin width based on a design rule of the semiconductor integrated circuit, which is connected to the wirings. Each of the pins is arranged in a vicinity of the peripheral edge of the hard macro main body with a minimum isolated space based on the design rule provided therebetween along a direction crossing with a width direction of the peripheral edge. The wirings are arranged obliquely along a direction crossing with a perpendicular direction of the peripheral edge.

7 Claims, 14 Drawing Sheets

F I G. 1
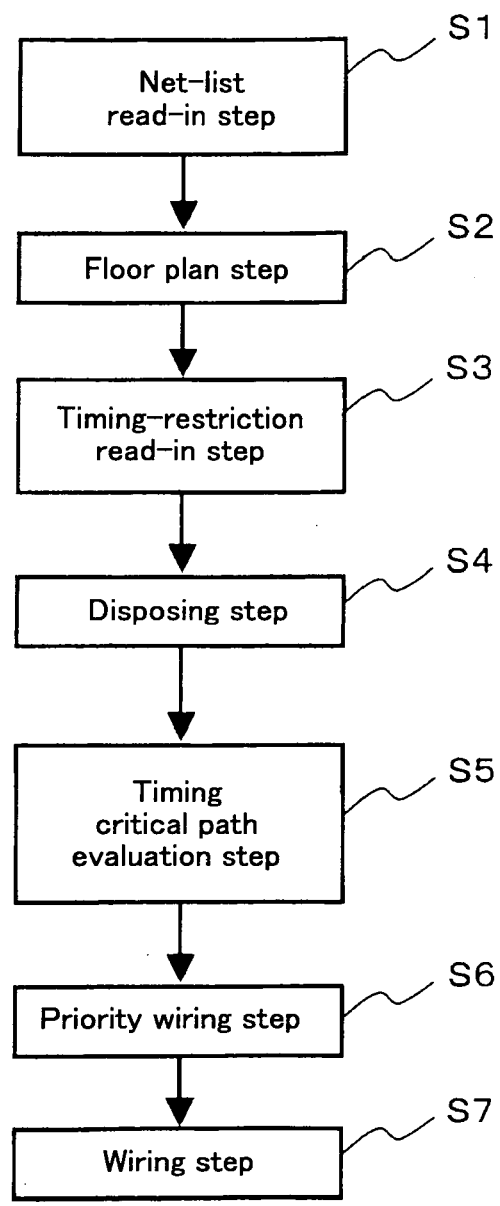

F I G. 1 3   PRIOR ART
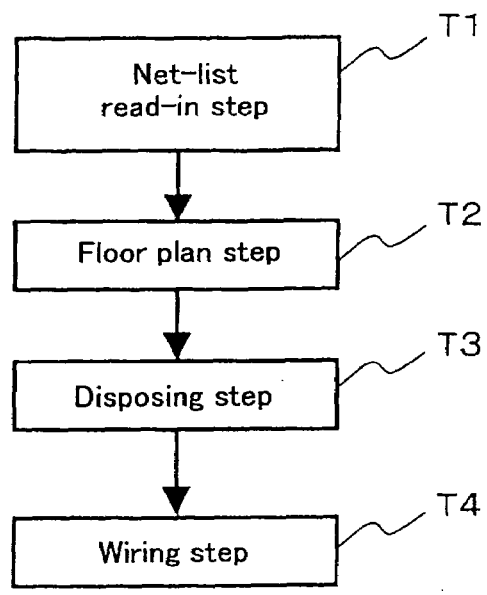
F I G. 1 4   PRIOR ART
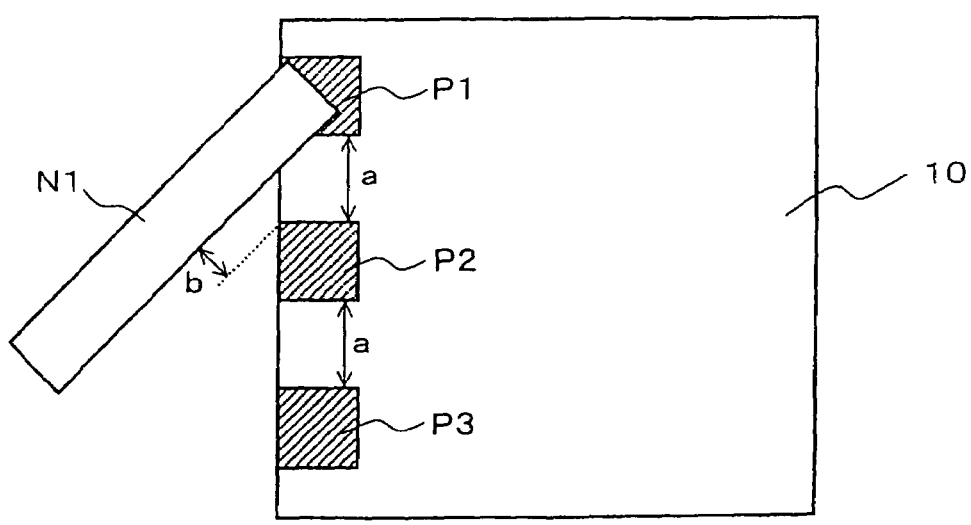

_US 7,636,906 B2_

SEMICONDUCTOR INTEGRATED CIRCUIT AND LAYOUT DESIGNING METHOD OF THE SAME

BACKGROUND OF THE INVENTION

Field of the Invention

The present invention relates to a layout designing method of a semiconductor integrated circuit and, more particularly, to a layout designing method that eases congestion of the wirings in accessing to pins of a macro cell through the use of an oblique wiring in a layout designing step and to a semiconductor integrated circuit having a pin structure capable of easing the wiring congestion.

Only longitudinal/horizontal wirings have been used in a conventional layout designing method of a semiconductor integrated circuit. Recently, a layout designing method that uses oblique wirings has been employed from the point of view that it is advantageous for reducing the number of vias, shortening the lengths of the wirings, and cutting down the area of chips.

FIG. 13 is flowchart for illustrating the conventional layout designing method of a semiconductor integrated circuit. In the conventional layout designing method, a net list is read into an automatic layout/wiring tool in a net-list read-in step T1. Then, fixed disposition of the cells other than logic cells such as hard macros, I/O cells and the like in a floor plan step T2 is performed. Subsequently, disposing processing of the logic cells is carried out in a following disposing step T3, and a wiring step T4 is carried out at last.

FIG. 14 shows the state of a hard macro 10 in which oblique wirings N1 declined by 45° are to be connected to pins P1 lined at a minimum interval "a" [μm] ("a" is any positive number). The minimum space means the minimum distance between the wirings, which has to be secured according to a design rule of the semiconductor integrated circuit. Further, the oblique wiring N1 indicates the wiring of the following form. Normally, wirings are arranged along a direction (perpendicular direction of the pin-disposed peripheral edge) which is orthogonal to the arranging direction of the pin P1 (the width direction of the pin-disposed peripheral edge of the hard macro 10). On the contrary, the oblique wiring N1 is arranged along an inclined direction (for example, by 45°) with respect to the direction that is orthogonal to the arranging direction of the pin P1.

As can be seen from FIG. 14, when connecting the oblique line N1 directly to the pin P1, the space between the oblique wiring N1 and the pin P2 that is next to the pin P1 to be connected becomes the space "b" [μm] ("b" is any positive number). In that case, the space "b"[μm] is not the value satisfying the minimum space "a" [μm] as it becomes "b<a". Thus, it generates a design rule error.

In order to avoid such inconvenience, as shown in FIG. 15A, oblique wirings N1-N3 arranged with the minimum space "a" is connected to longitudinal/horizontal wirings H1-H3 also arranged with the minimum space "a" in the current wiring method. Then, those longitudinal/horizontal wirings H1-H3 are connected to the pins P1-P3 lined with the minimum space "a" in the hard macro 10. The pins P1-P3 are disposed through a plurality of wiring layers that are being stacked, so that it is possible to connect to the pins P1-P3 from the plurality of wirings.

When the oblique wirings N1-N3 and the longitudinal/horizontal wirings H1-H3 are provided on the different wiring layers, it is necessary to provide vias V for connecting both wirings. When both wirings are arranged apart from each other with two or more layers interposed therebetween, the wiring layers of two or more layers are required for connecting both wirings as the via V of a stacked-via structure is required. The stacked via means a via formed in a columnar shape by disposing to stack the via of the first wiring layer and the via of the second wiring layer different from the first one.

In the conventional technique described above, when there is a stacked via comprising a plurality of wiring layers, it is necessary to set the wirings by avoiding the stacked via. Therefore, the wiring resource cannot be utilized fully. It leads to an increase in the use amount of the wiring resource and thereby cause congestion of the wirings that a plurality of stacked vias is formed in the periphery of the hard macro 10 in the structure shown in FIG. 15A. Furthermore, as shown in FIG. 15B, when the oblique wirings N1-N3 and the longitudinal/horizontal wirings H1-H3 are provided on the same wiring layer, it comes in the same state as if the pins P1-P3 in the hard macro 10 are extended by the longitudinal/horizontal wirings H1-H3. Thus, the area of the hard macro 10 becomes apparently larger, which leads to an increase in the area of the chip when it has a great number of hard macros loaded thereon.

SUMMARY OF THE INVENTION

The main object of the present invention relates to a layout designing method of a semiconductor integrated circuit, and in particular to ease the wiring congestion when connecting to the pins of a hard macro by using oblique wirings in a layout designing step.

In order to achieve the aforementioned object, the present invention employs a pin structure that is capable of avoiding the wiring congestion in the periphery of the hard macro. The hard macro comprises a hard macro main body, and a plurality of pins with a minimum pin width "c" that is required for signal transmission, which are connected to the wirings. Each of the pins is arranged in a vicinity of peripheral edge of the hard macro main body with a minimum isolated space "a" according to the design rule of semiconductor integrated circuit along a direction crossing with a width direction of the peripheral edge on the plane. The wirings are arranged obliquely along a direction crossing with a perpendicular direction of the peripheral edge. By doing this, it becomes possible to connect the pins directly to the wirings that are arranged obliquely with the minimum isolated space "a" of the design rule provided therebetween, and to connect the pins directly to the wirings arranged with the minimum isolated space "a" provided therebetween along the perpendicular direction of the peripheral edge.

A layout designing method of a semiconductor integrated circuit according to the present invention comprises the steps of:

a net-list read-in step for reading a net list containing a logic-cell group that comprises one or more logic cells necessary for actual operation, into an automatic layout wiring tool;

a floor plan step for fixedly arranging cells except for a hard macro and logic cells;

a timing-restriction read-in step for reading timing restriction of the logic-cell group into the automatic layout tool;

a disposing step for arranging the logic-cell group in a cell deployable region;

a timing critical path evaluation step for specifying a timing critical path that is connected to the hard macro through an oblique wiring with precedence, among one or more timing critical paths set in the logic-cell group;

an oblique wiring step for setting the oblique wiring to the timing critical path that is specified in the timing critical path evaluation step; and a basic wiring step for setting wirings of signal paths other than the timing critical path to which the oblique wiring is set according to the net list.

It is preferable for the timing critical path evaluation step to comprise the steps of:

a virtual wiring step for predicting wiring paths of the respective signal paths provided between the hard macro and the logic cells that are connected to the relevant hard macro through signals;

a wiring length analyzing step for calculating respective wiring lengths of the timing critical paths based on a prediction result of the virtual wiring step; and a priority-part judging step for specifying the timing critical path whose wiring length calculated in the wiring length analyzing step is a prescribed value or more as a path to which the oblique wiring is set with precedence.

According to this, the wiring length can be shortened through setting the path as the oblique wiring that is predicted to require a long-distance wiring, by giving priority to the path over other signal paths, to the timing critical path which is capable of directly connecting to the pin of the hard macro. As a result, the timing-reach time can be shortened and the margin for setup timing can be increased.

Further, the timing critical path evaluation step is preferable to comprise the steps of:

a virtual wiring step for predicting wiring paths of the respective signal paths provided between the hard macro and the logic cells that are connected to the relevant hard macro through signals;

a wiring load capacity analyzing step for calculating wiring load capacities of the respective signal paths based on a prediction result of the virtual wiring step; and a priority-part judging step for specifying the timing critical path whose wiring load capacity calculated in the wiring load capacity analyzing step is a prescribed value or more, as a path to which the oblique wiring is set with precedence.

By doing this, a value of the wiring load capacity can be reduced through setting the oblique wiring to the timing critical path that is capable of directly connecting to the pin of the hard macro and is predicted to have a large wiring load capacity by giving priority over other signal paths. As a result, it is possible to suppress dullness of signals in the timing critical paths.

Furthermore, it is preferable for the timing critical path evaluation step to comprise the steps of, though the order of the wiring length analyzing step and the wiring load capacity analyzing step is determined arbitrarily:

a virtual wiring step for predicting wiring paths of the respective signal paths provided between the hard macro and the logic cells that are connected to the relevant hard macro through signals;

a wiring length analyzing step for calculating respective wiring lengths of the timing critical paths based on a prediction result of the virtual wiring step;

a wiring load capacity analyzing step for calculating wiring load capacities of the respective timing critical paths based on a prediction result of the virtual wiring step; and a priority-part judging step for specifying the timing critical path whose wiring length calculated in the wiring length analyzing step is a prescribed value or more and whose wiring load capacity calculated in the wiring load capacity analyzing step is a prescribed value or more, as a path to which the oblique wiring is set with precedence.

According to this, the wiring length and the wiring load capacity can be reduced through setting the oblique wiring by giving priority over other signal paths to the timing critical path that is capable of directly connecting to the pin of the hard macro, which is predicted to be a long-distance wiring and to have a large wiring load capacity. As a result, the timing-reach time can be shortened and the margin for setup timing can be sufficiently increased. At the same time, it is possible to suppress dullness of signals in the timing critical path.

A semiconductor integrated circuit of the present invention comprises a hard macro and a plurality of wirings connected to the hard macro, wherein:

the hard macro comprises a hard macro main body, and a plurality of pins with a minimum pin width "c" based on a design rule of the semiconductor integrated circuit, which are connected to the wirings;

each of the pins is arranged in the hard macro main body at an interval with a minimum isolated space "a" based on the design rule of the semiconductor integrated circuit along a direction crossing at a plane to a width direction of the peripheral edge of the hard macro main body; and the wirings are arranged obliquely along a direction crossing with a perpendicular direction of the peripheral edge.

It is preferable that a layout pitch of the pins along a width direction of the peripheral edge is "a+c", and a layout pitch of the pins along the perpendicular direction of the peripheral edge is "$2^{1/2}a/2$".

According to this, the oblique wirings can be arranged at a high storage efficiency by making the space between each of the pins and the space between each of the oblique wirings both set as the minimum values based on the design rule.

It is preferable for the pins to be provided on each of opposing peripheral edges of the hard macro main body, and for an arranging direction of the pins provided on one of the peripheral edges and an arranging direction of the pins provided on other peripheral edge to cross with each other.

Further, it is preferable for the pins to be provided on each of opposing peripheral edges of the hard macro main body, and also for an arranging direction of the pins provided on one-end side of one of the peripheral edges and an arranging direction of the pins provided on other-end side of other peripheral edge to be in parallel to each other along the width direction of the peripheral edges; and an arranging direction of the pins provided on other-end side of the one of the peripheral edges and an arranging direction of the pins provided on one-end side of the other peripheral edge to cross with each other.

Furthermore, the pins are provided on each of opposing peripheral edges of the hard macro main body; wherein it is preferable that arranging directions of the pins provided on each of one-end sides of the peripheral edges and arranging directions of the pins provided on each of other-end sides of the peripheral edges cross with each other;

an arranging direction of the pins provided on one-end side of the one of the peripheral edges and an arranging direction of the pins provided on one-end side of the other peripheral edge cross with each other; and an arranging direction of the pins provided on other-end side of the one of the peripheral edges and an arranging direction of the pins provided on other-end side of the other peripheral edge cross with each other.

According to the above-described additional structure, it becomes unnecessary to form the vias due to an enlarging of the pins or transfer of the wirings in the periphery of the pin connected to the timing critical path surrounded by the cell deployable region away from the I/O cells. Thereby, the wiring resources along the four directions of the hard macro can be utilized effectively, which enables prevention of the wiring congestion in the periphery of the hard macro.

The present invention provides the following effects. First, the oblique wirings arranged with the minimum space can be connected directly to the pins while maintaining the minimum-space layout of the pins. Thus, it is unnecessary to form the stacked vias as there is no transfer of the wirings. As a result, because no drawing around of the wirings or the like is generated, the wiring resources can be utilized effectively and thereby the wiring congestion can be eased.

Secondly, the wiring length can be shortened since the oblique wirings can be connected directly to the pins. As a result, transmission of the signals can be accelerated. Thirdly, since the oblique wirings can be connected directly to the pins, it becomes unnecessary to enlarge the pins, thereby it is possible to reduce the chip area. Fourthly, since the oblique wirings can be connected directly to the pins, it is unnecessary to provide the vias. For that, the yield can be improved.

The present invention providing such effects is effective as a method that avoids the wiring congestion through efficiently utilizing the wiring resources. In addition, the present invention achieves such effects without a lot of changes of a current form to manufacture the pins. Furthermore, with the present invention, it becomes easy to deal with the wiring layout along oblique directions.

BRIEF DESCRIPTION OF THE DRAWINGS

Other objects of the present invention will become clear from the following description of the preferred embodiments and be demonstrated in the appended claims. Those skilled in the art will appreciate that there are many other advantages of the present invention that have not been mentioned in the specification by embodying the present invention.

FIG. 1 is a flowchart for showing the processing of a layout designing method of a semiconductor integrated circuit according to a first embodiment of the present invention;

FIG. 13 is a flowchart for showing the processing of a layout designing method of a semiconductor integrated circuit of the related art;

FIG. 14 is a diagram for showing the pin structure of the hard macro and the oblique wirings according to the related art;

DETAILED DESCRIPTION OF THE INVENTION

Preferred embodiments of the present invention will be described hereinafter by referring to the accompanying drawings.

First Embodiment

FIG. 1 is a flowchart for showing the processing of a layout designing method of a semiconductor integrated circuit according to a first embodiment of the present invention.

First, a net list containing logic-cell group necessary for actual operation is read into an automatic layout tool in a net-list read-in step S1. Then, cells other than the logic cells such as a hard macro and I/O cell are fixedly disposed beforehand in a floor plan step S2, and the timing restriction of the timing critical path is read into the automatic layout tool in a timing-restriction read-in step S3. Then, like the disposing step T3 of the conventional case, each logic cell is disposed in a disposing step S4 in a region where the cells can be arranged.

Then, the timing critical path is specified in a timing critical path evaluation step S5 based on the timing restriction read in advance. Subsequently, in a priority wiring step S6, wiring is performed by giving priority to the timing critical path specified in step S5 in order to secure the wiring paths and the like. Then, in a wiring step S7, wiring is performed, according to the net list, to signal paths other than the timing critical path that has preferentially been wired in a priority wiring step S6. The wiring step S7 is the same as the conventional wiring step T4.

Figure 2:
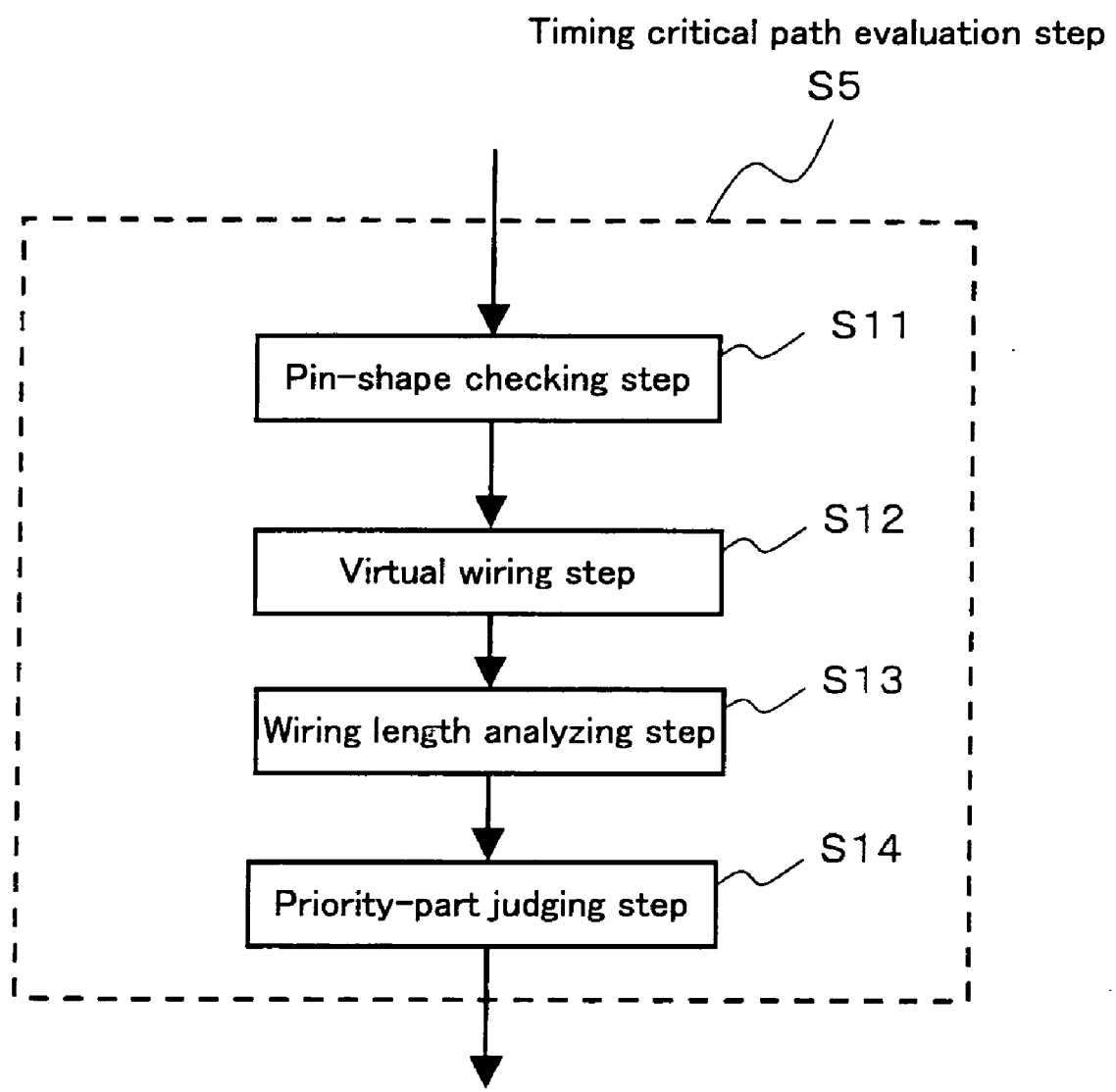
FIG. 2 is a flowchart for showing the specific processing of a timing critical path evaluation step according to the first embodiment of the present invention.

FIG. 2 is a flowchart for showing the specific processing of the timing critical path evaluation step S5. First, the pin-shape of the hard macro is checked in a pin-shape checking step S11 and it is checked whether or not the oblique wiring can be directly connected to the pin of the hard macro. The oblique wiring is the wiring that is arranged along an inclined direction (for example, by 45°) whit respect to direction that is orthogonal to the arranging direction of the pin of the hard macro.

Subsequently, in a virtual wiring step S12, the virtual wirings is carried out in the pins of the hard macro to which the oblique wirings can be directly connected by predicting the wiring paths of each signal. Then, in a wiring length analysis step S13, the wiring lengths of each timing critical path is calculated based on the predicted virtual wiring. After that, in a priority-part judging step S14, the oblique wiring is set by giving priority to the timing critical path whose wiring length becomes a prescribed value or more (long-distance wiring).

According to the embodiment as described above, when it is predicted that the timing critical path capable of directly making access to the pin of the hard macro is the wiring of long distance, the oblique wiring is set for the timing critical path in preference to the other signal paths for shortening the wiring length. As a result, it becomes possible to shorten the timing-reach time and increase the margin for setup timing.

Second Embodiment

Figure 3:
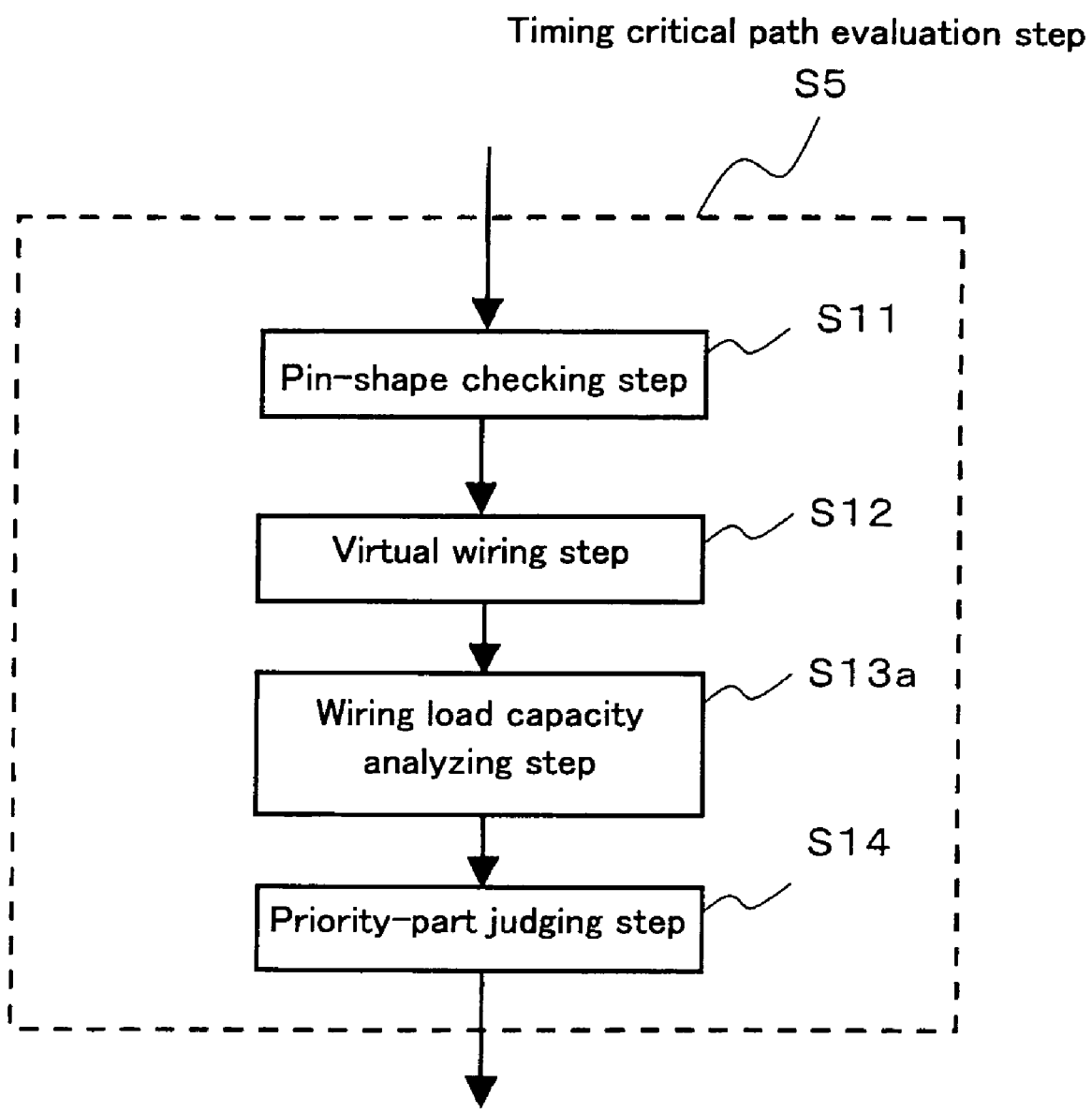
FIG. 3 is a flowchart for showing the specific processing of a timing critical path evaluation step according to a second embodiment of the present invention.

FIG. 3 is a flowchart for showing the specific processing of a timing critical path evaluation step S5 according to a second embodiment of the present invention. This embodiment comprises a wiring load capacity analyzing step S13a that calculates the wiring load capacities of each timing critical path based on the result of virtual wiring, after the pin-shape checking step S11 and the virtual wiring step S12 of the case of the above-described first embodiment shown in FIG. 2. Then, in the following priority-part judging step S14, the oblique wiring is set preferentially to the timing critical path whose wiring load capacity is a prescribed value or more.

According to the embodiment as described above, the oblique wiring is set to the timing critical path capable of directly connecting to the pin of the hard macro, which is predicted to have a large wiring load capacity, in preference to the other signal paths in order to reduce the wiring load capacity value. As a result, it becomes possible to suppress dullness of signals in the timing critical paths.

Third Embodiment

Figure 4:
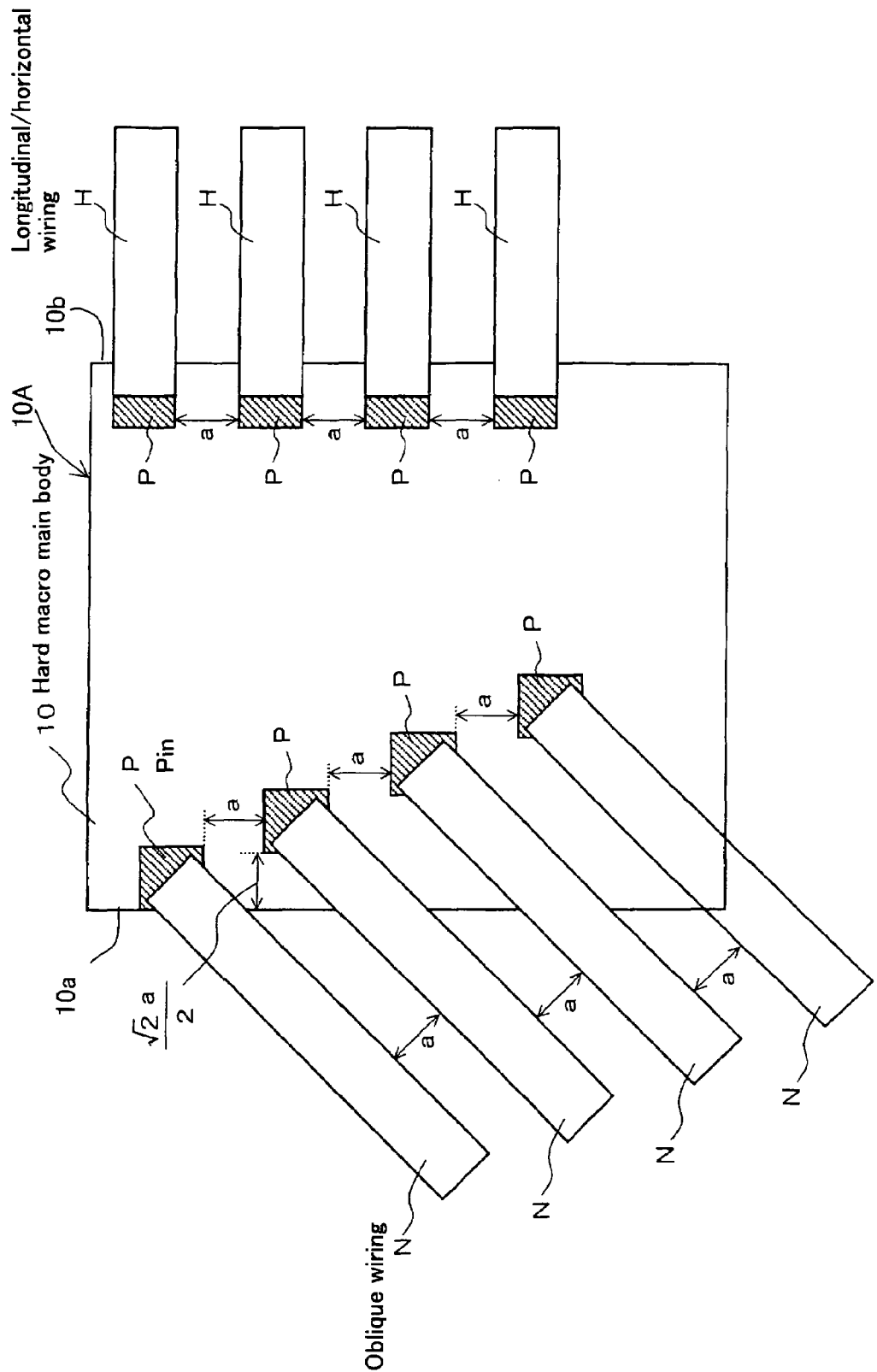
FIG. 4 is a schematic diagram for showing the pin structure of a hard macro according to a third embodiment of the present invention.

FIG. 4 is a schematic diagram for showing the structure of a semiconductor integrated circuit according to a third embodiment of the present invention. The semiconductor integrated circuit according to this embodiment comprises a hard macro 10A, oblique wirings N, and longitudinal/horizontal wirings H. The hard macro 10A comprises a hard macro main body 10, and a plurality of pins P provided on the top face thereof along each of peripheral edges 10a, 10b of the hard macro main body 10. Among the groups of pins P, the group of pins P provided on one of the peripheral edges (the peripheral edge 10a in FIG. 4) are not arranged along the width direction of the peripheral edge but arranged along the oblique direction that crosses with the width direction of the peripheral edge. In other words, each of the pins P comprising the group of the pins P is arranged each other out of alignment in a step-like form on the inside of the hard macro 10A in the plane direction thereof along the width directions of each peripheral edge. Thereby, the oblique wirings N can be connected directly to the pins P even when the oblique wirings N are set as the connection targets to the group of pins P. Furthermore, like the pin structure of the conventional hard macro, the group of pins P provided on the other peripheral edge (the peripheral edge 10b in FIG. 4) are arranged along the width direction of the peripheral edge, and the longitudinal/horizontal wirings H can be directly connected thereto. The oblique wiring means the wiring arranged at a slant along the direction that crosses with the perpendicular direction of the peripheral edge of the hard macro main body 10. The longitudinal/horizontal wiring H means the wiring arranged along the perpendicular direction of the peripheral edged of the hard macro main body 10.

In FIG. 4, reference code "a" is the minimum isolated space between the adjacent pins P according to a design rule of the semiconductor integrated circuit, and the oblique wirings N are also arranged with the same minimum isolated space "a". Therefore, it is possible to connect the wirings in the longitudinal/horizontal directions and the oblique direction as well with the minimum space "a".

Figure 5:
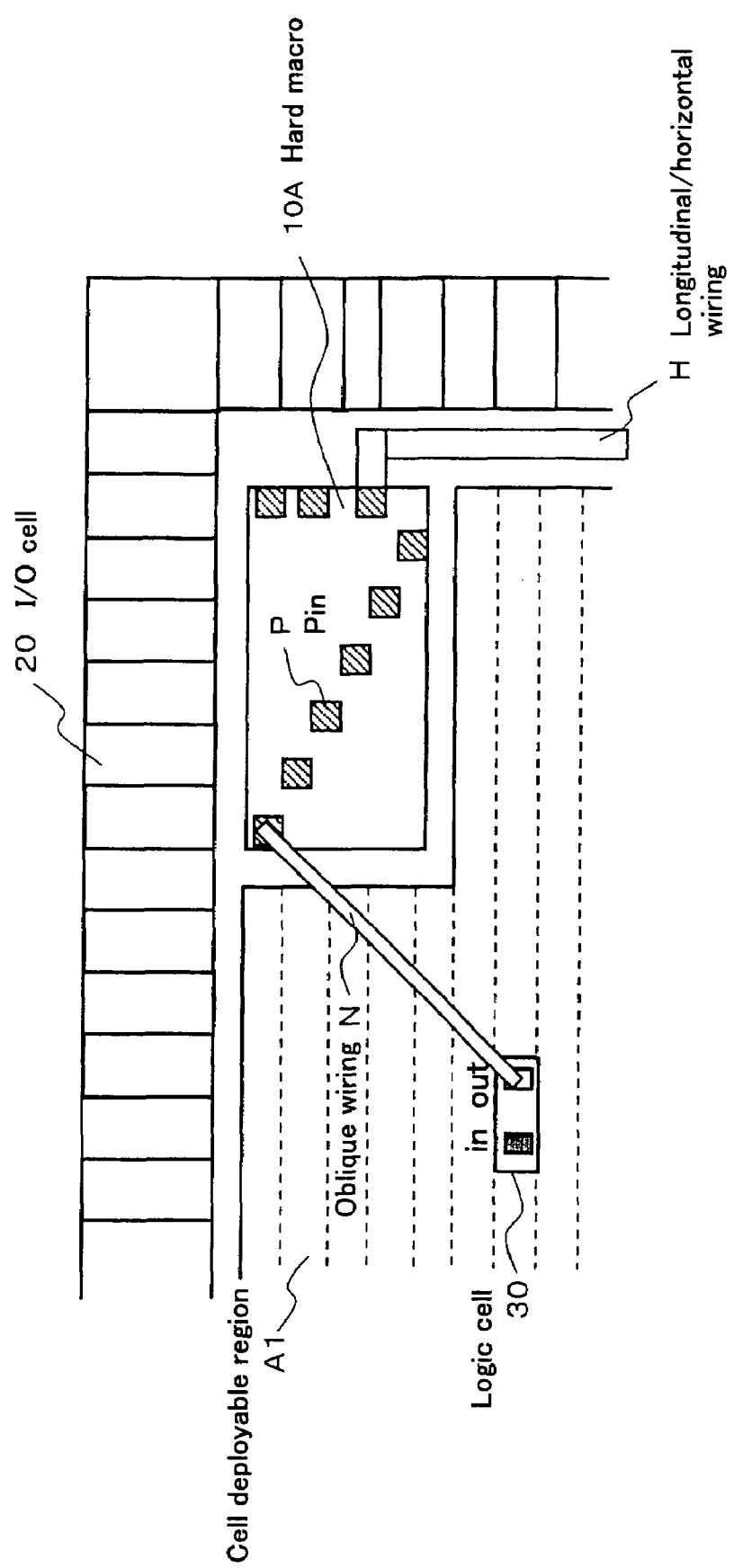
FIG. 5 is a schematic diagram for showing a use example of the hard macro according to the third embodiment of the present invention.

FIG. 5 is a schematic diagram for showing a use example of the hard macro 10A. It is shown there that oblique wirings N leading out of a logic cell 30 provided in a cell deployable region A1 to the direction of I/O cells 20, can be directly connected to the pins P of the hard macro 10A placed at a corner of the semiconductor integrated circuit.

According to the embodiment as described above, it becomes unnecessary to extend the pins P or to generate the vias for transferring the wirings even in the periphery of the pin P that is the timing critical path of the hard macro 10A placed at the corner sandwiched between the I/O cells. Thereby, the wiring resource can be utilized effectively, which enables prevention of the wiring congestion in the periphery of the hard macro.

Fourth Embodiment

Figure 6:
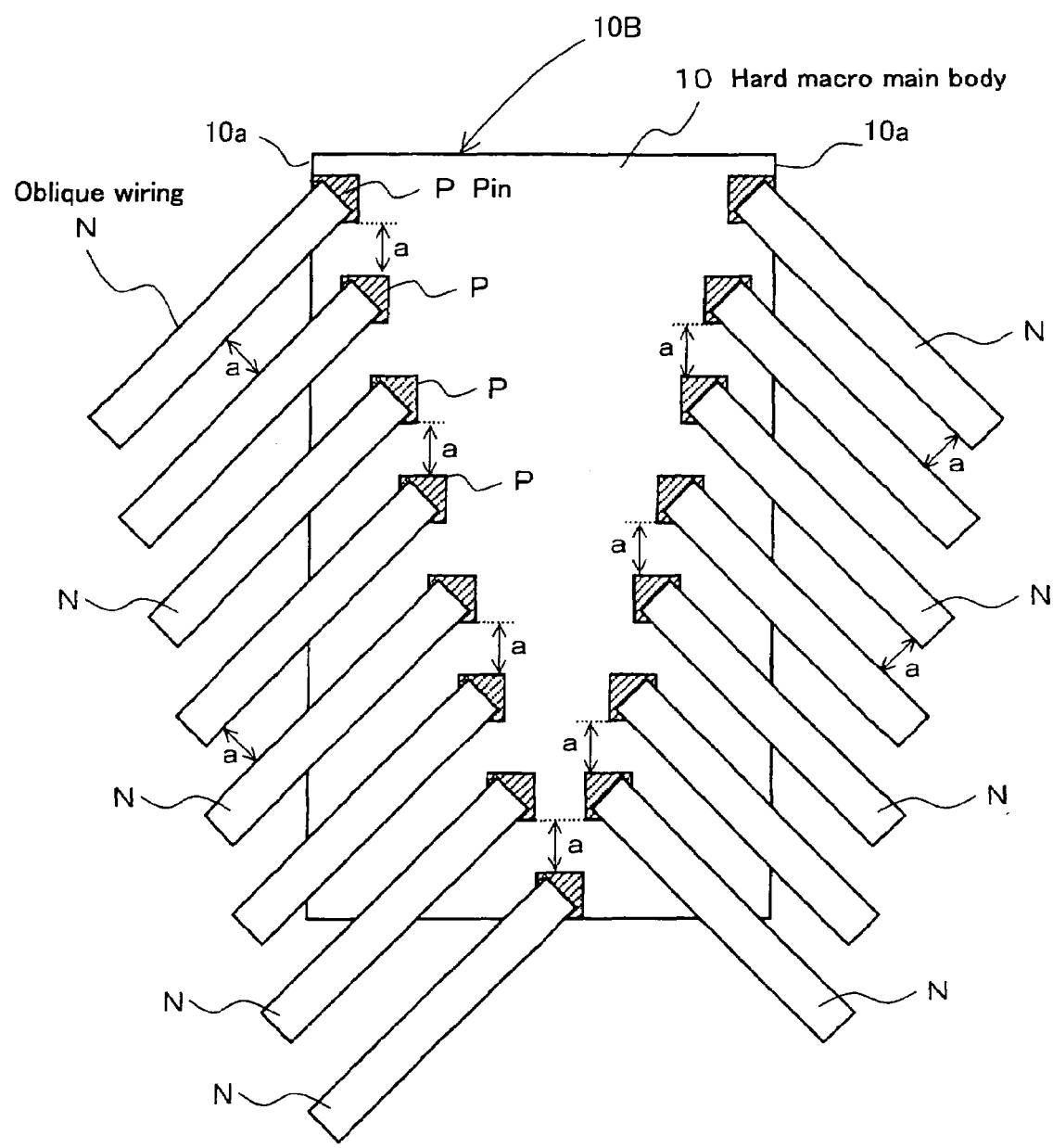
FIG. 6 is a schematic diagram for showing the pin structure of a hard macro according to a fourth embodiment of the present invention.

FIG. 6 is a schematic diagram for showing the structure of a semiconductor integrated circuit according to a fourth embodiment of the present invention. The semiconductor integrated circuit according to this embodiment comprises a hard macro 10B and oblique wirings N. The hard macro 10B comprises a hard macro main body 10, and a plurality of pins P provided on the top face thereof along each of peripheral edges 10a, 10b of the hard macro main body 10. The peripheral edge 10a and the peripheral edge 10b oppose each other. The groups of pins P are not arranged along the width directions of the peripheral edges 10a and 10b, but arranged along the oblique direction that crosses with the width directions of the peripheral edges 10a and 10b. Furthermore, the arranging direction of the group of puns P provided on the peripheral edge 10a and the arranging direction of the group of pins P provided on the peripheral edge 10b cross with each other. Thereby, the oblique wirings N can be connected directly to the pins P even when the oblique wirings are set as the connection targets of the groups of pins P provided on both peripheral edges 10a and 10b.

In FIG. 6, reference code "a" is the minimum isolated space between the adjacent pins P according to the design rule of the semiconductor integrated circuit, and the oblique wirings N are also arranged with the same minimum isolated space "a". Therefore, it is possible to connect the wirings in the longitudinal/horizontal directions and the oblique direction as well with the minimum space "a".

Figure 7:
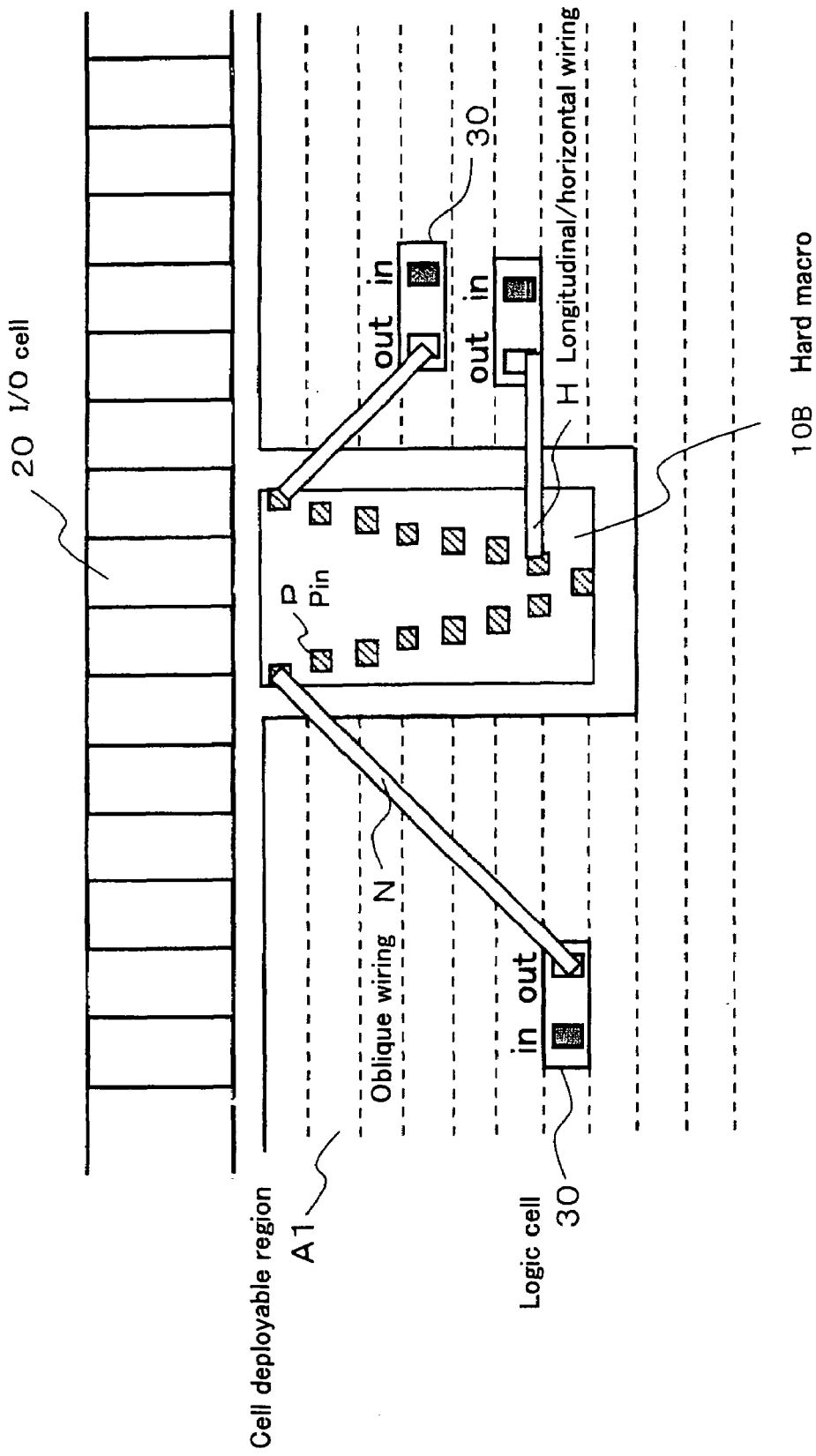
FIG. 7 is a schematic diagram for showing a use example of the hard macro according to the fourth embodiment of the present invention.

FIG. 7 is a schematic diagram for showing a use example of the hard macro 10B. It is shown that oblique wirings N, which extend in the direction of the I/O cells 20 from the logic cell 30 provided in the cell deployable region A1, can be directly connected to the pins P of the hard macro 10B placed against the backdrop of the I/O cells of the semiconductor integrated circuit.

Compared to the case of the third embodiment, the fourth embodiment is capable of connecting the oblique wirings N directly to the pins P of the hard macro 10B from both sides of them. Furthermore, it is also possible to connect the wirings to the pins P from the longitudinal/horizontal directions.

According to the embodiment as described above, it becomes unnecessary to extend the pins P or to generate the vias for transferring the wirings even in the periphery of the pin P that is the timing critical path of the hard macro 10B placed against the backdrop of the I/O cells. Thereby, the wiring resource can be utilized effectively, which enables prevention of the wiring congestion in the periphery of the hard macro.

Fifth Embodiment

Figure 8:
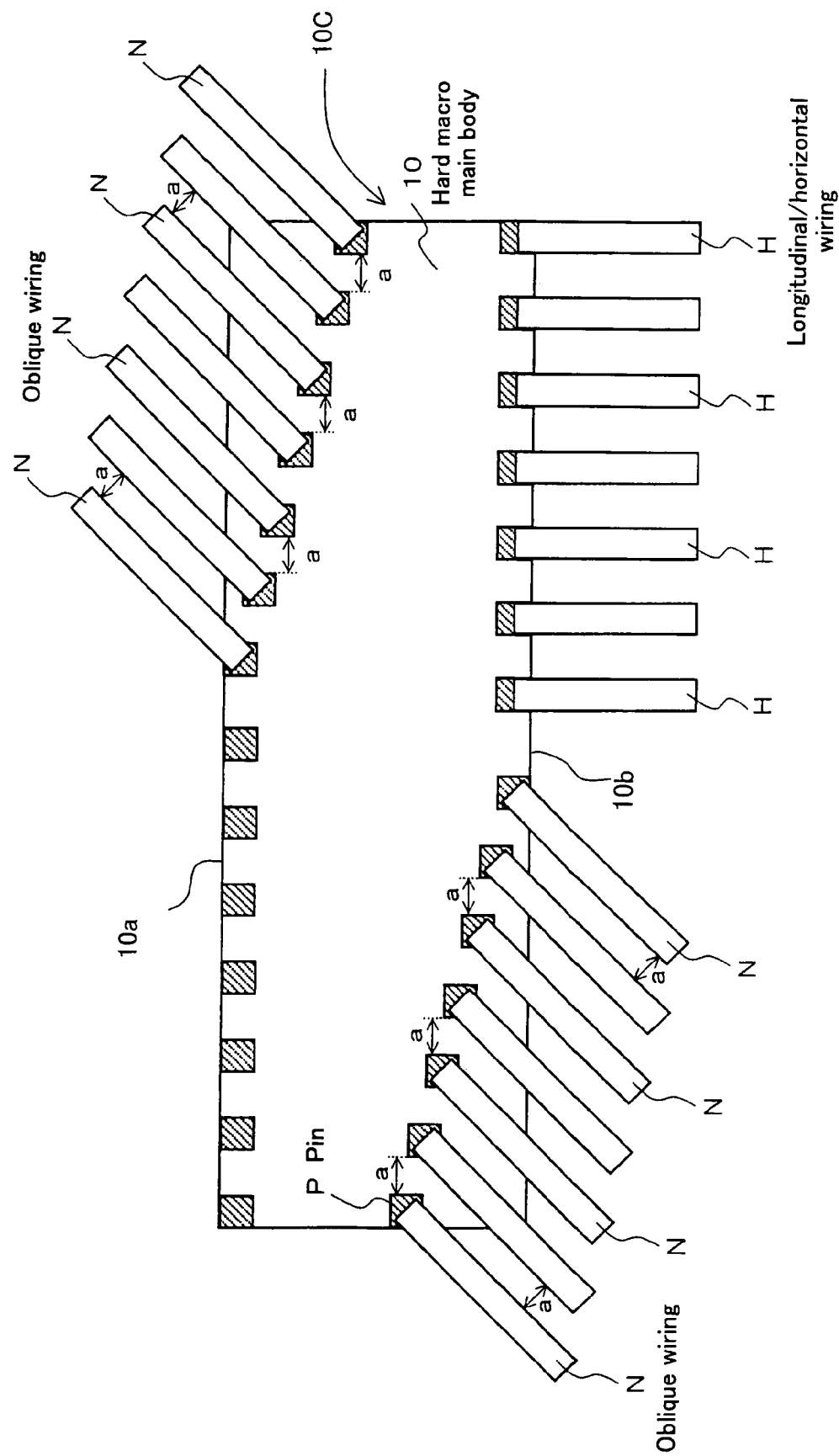
FIG. 8 is a schematic diagram for showing the pin structure of a hard macro according to a fifth embodiment of the present invention.

FIG. 8 is a schematic diagram for showing the structure of a semiconductor integrated circuit according to a fifth embodiment of the present invention. The semiconductor integrated circuit according to this embodiment comprises a hard macro 10C, oblique wirings N, and longitudinal/horizontal wirings H. The hard macro 10C comprises a hard macro main body 10, and a plurality of pins P provided on the top face thereof along each of peripheral edges 10a, 10b of the hard macro main body 10. The peripheral edge 10a and the peripheral edge 10b oppose each other. Among the groups of pins P, the group of pins P provided on one-end side of the peripheral edge 10a and the group of pins P provided on other-end side of the peripheral edge 10b are not arranged along the width directions of the peripheral edges 10a and 10b, but arranged along the oblique direction that crosses with the width directions of the peripheral edges 10a and 10b. Thereby, the oblique wirings N can be connected directly to the pins P even when the oblique wirings are set as the connection targets of the groups of pins P. Furthermore, like the pin structure of the conventional macro, among the groups of pins P, the group of pins P provided on the other-end side of the peripheral edge 10a and the group of pins P provided on one-end side of the peripheral edge 10b are arranged in parallel to each other along the width directions of the peripheral edges. Thereby, the groups of pins P can be connected directly to the longitudinal/horizontal wirings H.

In FIG. 8, reference code "a" is the minimum isolated space between the adjacent pins P according to the design rule of the semiconductor integrated circuit, and the oblique wirings N are also arranged with the same minimum isolated space "a". Therefore, it is possible to connect the wirings in the longitudinal/horizontal directions and the oblique direction as well with the minimum space "a".

Figure 9:
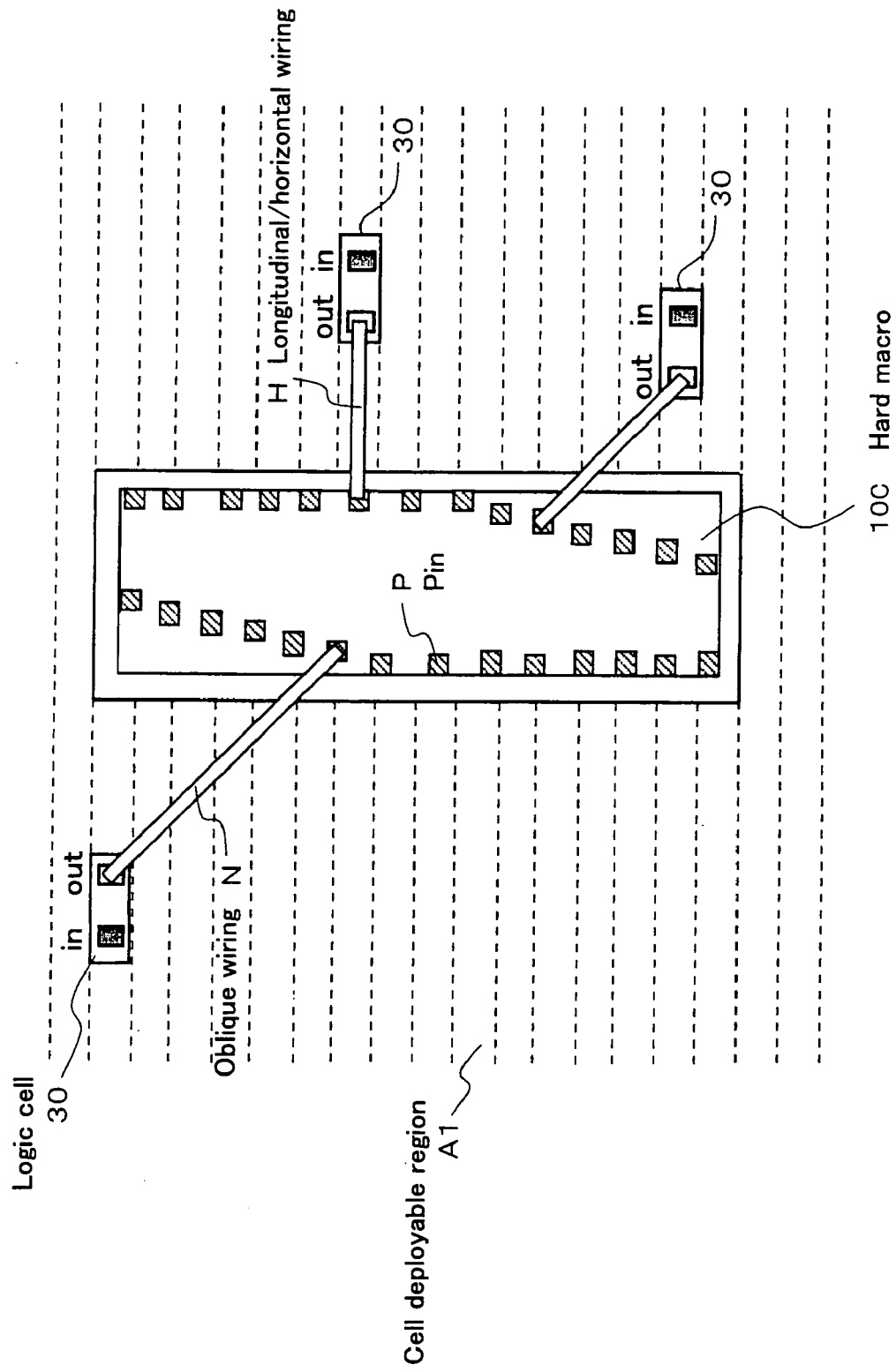
FIG. 9 is a schematic diagram for showing a use example of the hard macro according to the fifth embodiment of the present invention.

FIG. 9 is a schematic diagram for showing a use example of the hard macro 10C. It is shown that oblique wirings N, which extend in the direction of the hard macro 10C from the logic cell 30 provided in the cell deployable region A1, can be directly connected to the pins P of the hard macro 10C placed at the center in the plane direction of the semiconductor integrated circuit away from the I/O cells.

In this embodiment, the oblique wirings N can be directly connected to the pins P from the diagonal direction of the pins P. Furthermore, it is possible to connect the wirings to the pins P from the longitudinal/horizontal directions.

According to the embodiment as described above, it becomes unnecessary to extend the pins P or to generate the vias for transferring the wirings even in the periphery of the pin P that is the timing critical path of the hard macro 10C surrounded by the cell deployable region away from the I/O cells. Thereby, the wiring resource in the diagonal direction of the hard macro 10C can be utilized effectively, which enables prevention of the wiring congestion in the periphery of the hard macro.

Sixth Embodiment

Figure 10:
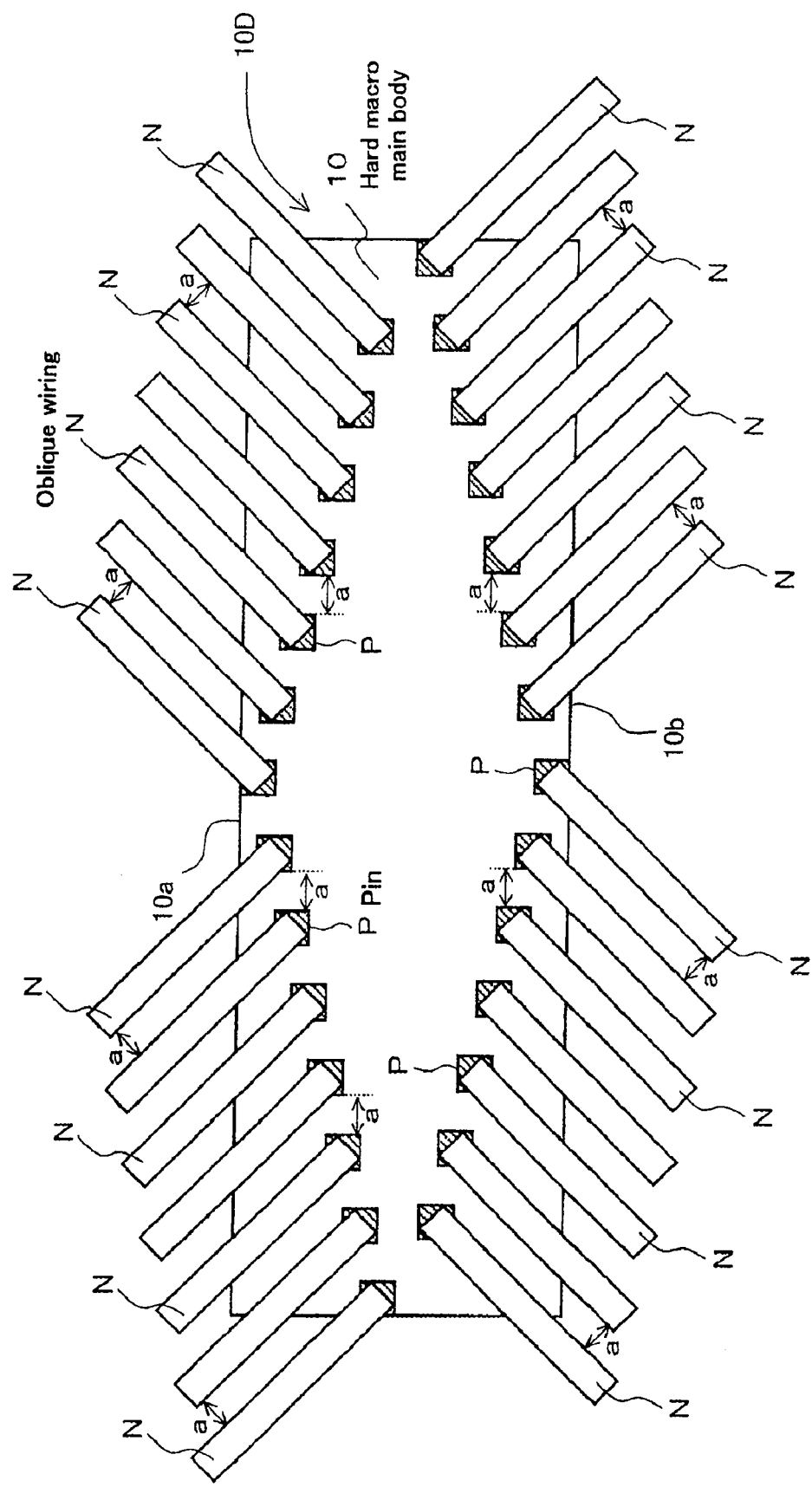
FIG. 10 is a schematic diagram for showing the pin structure of a hard macro according to a sixth embodiment of the present invention.

FIG. 10 is a schematic diagram from both sides for showing the structure of a semiconductor integrated circuit according to a sixth embodiment of the present invention. The semiconductor integrated circuit according to this embodiment comprises a hard macro 10D and oblique wirings N. The hard macro 10D comprises a hard macro main body, and a plurality of pins P provided on the top face thereof along each of peripheral edges 10a, 10b of the hard macro main body. The peripheral edge 10a and the peripheral edge 10b oppose each other. Among the pins P, the arranging direction of the pins P provided on the respective one-end sides of the peripheral edges 10a and 10b and the arranging direction of the pins P provided on the respective other-end sides of the peripheral edges 10a and 10b cross with each other. Further, the arranging direction of the pins P provided on one-end side of the peripheral edge 10a and the arranging direction of the pins P provided on one-end side of the peripheral edge 10b cross with each other, and the arranging direction of the pins P provided on the other-end side of the peripheral edge 10a and the arranging direction of the pins P provided on the other-end side of the peripheral edge 10b cross with each other. Thereby, the pins P are formed in a rhombic shape as a whole. Therefore, the oblique wirings N can be connected directly to the pins P even when the oblique wirings are set as the connection targets of the groups of pins P.

In FIG. 10, reference code "a" is the minimum isolated space between the adjacent pins P according to the design rule of the semiconductor integrated circuit, and the oblique wirings N are also arranged with the same minimum isolated space "a". Therefore, it is possible to connect the wirings in the longitudinal/horizontal directions and the oblique direction as well with the minimum space "a".

Figure 11:
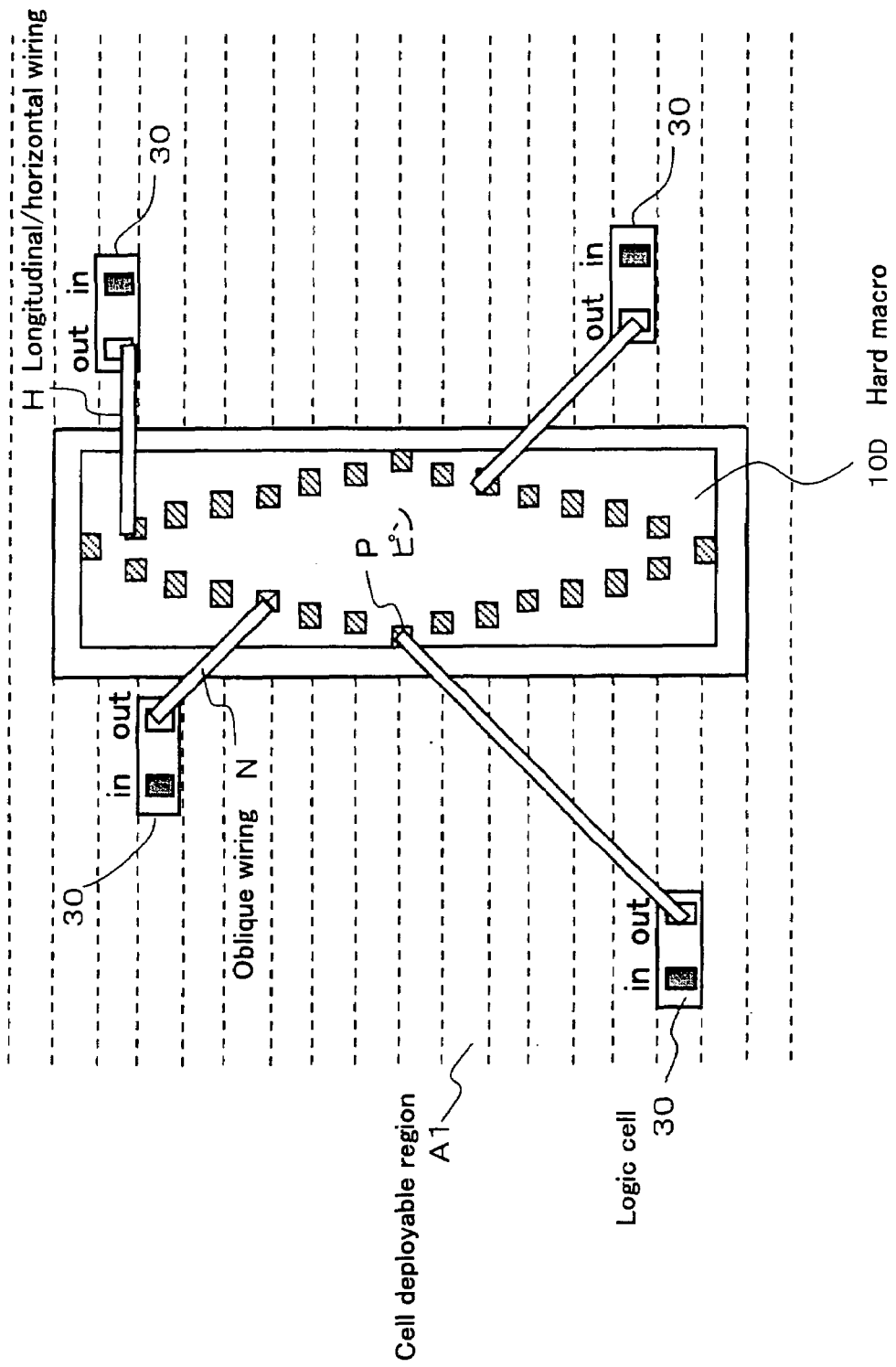
FIG. 11 is a schematic diagram for showing a use example of the hard macro according to the sixth embodiment of the present invention.

FIG. 11 is a schematic diagram for showing a use example of the hard macro 10D. It is shown that oblique wirings N, which extend in the direction of the hard macro 10D from the logic cell 30 provided in the cell deployable region A1, can be directly connected to the pins P of the hard macro 10D placed at the center of the semiconductor integrated circuit away from the I/O cells.

In this embodiment, the oblique wirings N can be directly connected to the pins P from the four directions. Thus, the wiring resource can be utilized effectively.

According to the embodiment as described above, it becomes unnecessary to extend the pins P or to generate the vias for transferring the wirings even in the periphery of the pin P that is the timing critical path of the hard macro 10D surrounded by the cell deployable region away from the I/O cells. Thereby, the wiring resource along the four oblique directions of the hard macro 10D can be utilized effectively, which enables prevention of the wiring congestion in the periphery of the hard macro.

Seventh Embodiment

A seventh embodiment of the present invention is constituted so that the hard macros 10A-10D are memory cells in the third to sixth embodiments described above. In this case, direct connection is made possible to the pins of the memory cells by using the oblique wirings N so as to enable high-speed transmission of the signals that are critical in the setup timing of the memory cells.

Eighth Embodiment

An eighth embodiment of the present invention is constituted so that the hard macros 10A-10D are analog macro cells in the third to sixth embodiments described above. In this case, influence of noise can be reduced by shortening the wiring length to the pins of the analog macro cell that is susceptible to the influence of the digital noise so as to reduce the wiring capacity.

Ninth Embodiment

A ninth embodiment of the present invention is constituted so that the hard macros 10A-10D are lower hierarchical blocks in the third to sixth embodiments described above. In this case, the oblique wirings can be directly connected to the signal path of the lower hierarchical block whose timing is critical, so as to thereby satisfy the setup time. Further, since the oblique wirings can be directly connected to the pins, the wiring lengths can be made uniform. Thereby, it becomes possible to suppress dispersions of the signal reach time for each pin compared to the case of the longitudinal/horizontal wirings.

Figure 12:
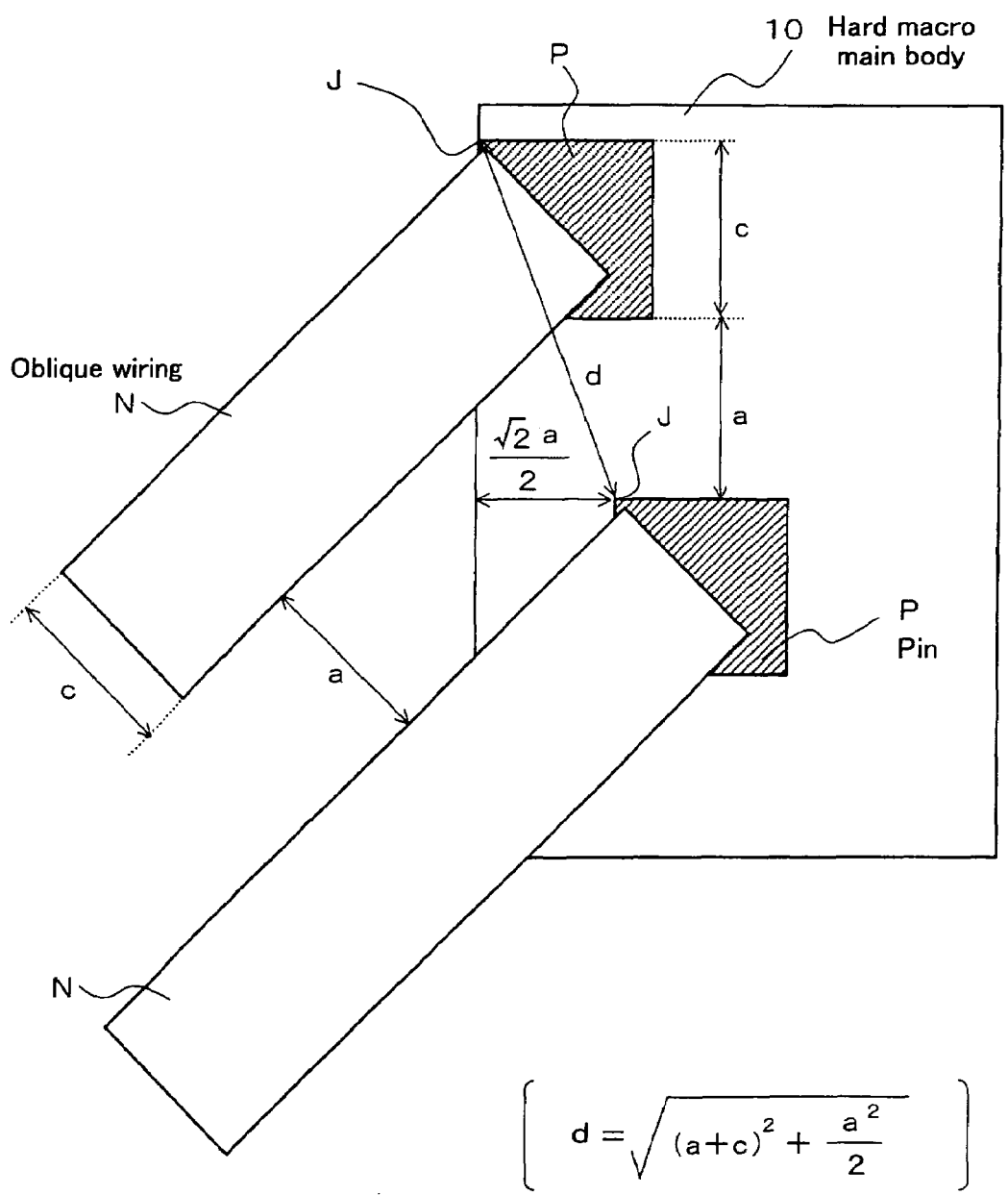
FIG. 12 is a schematic diagram for showing the distance between the adjacent pins of the hard macro according to a tenth embodiment of the present invention.
Figure 15A:
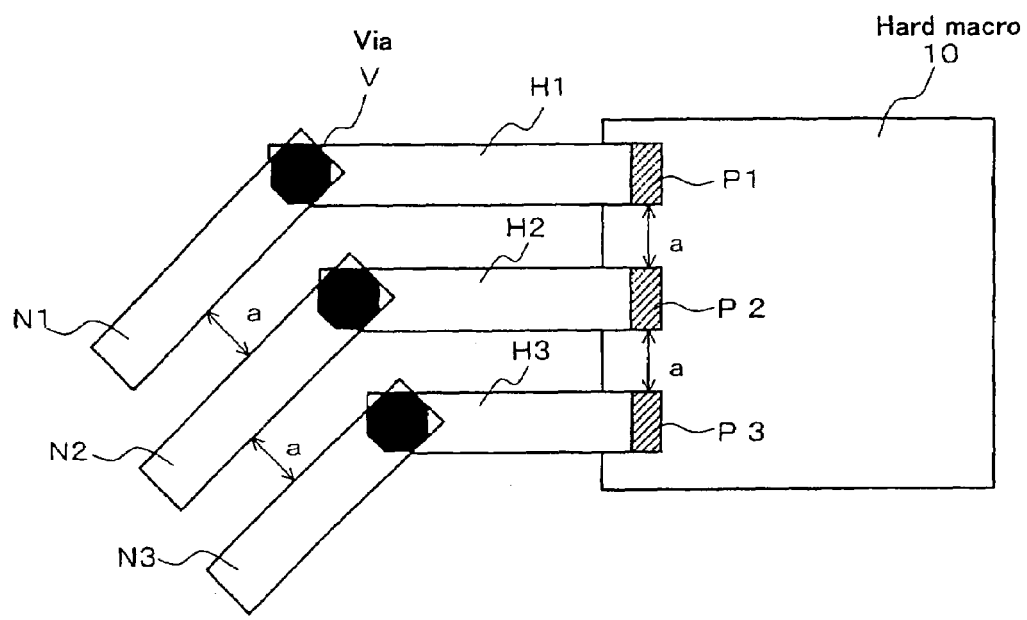
FIG. 15A is a diagram for illustrating the pin structure of the hard macro according to the related art and the connection from the oblique wirings to the longitudinal/horizontal wirings using vias.
Figure 15B:
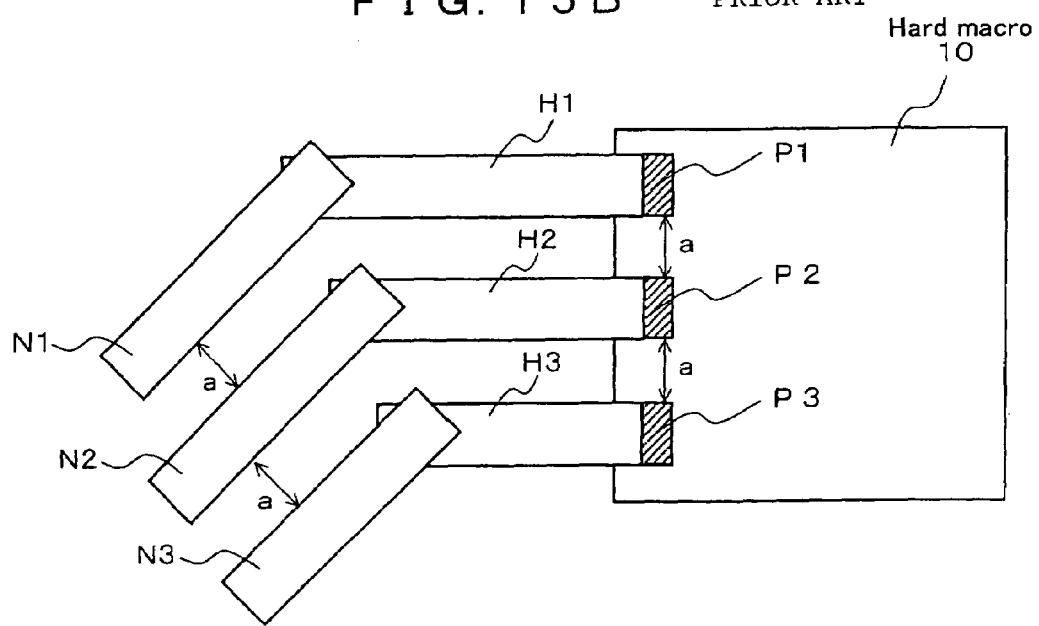
FIG. 15B is a diagram for illustrating the pin structure of the hard macro according to the related art and the connection from the oblique wirings to the longitudinal/horizontal wirings.

FIG. 12 is a schematic diagram for showing the positional relation of the adjacent pins in the hard macros 10A-10D. According to the design rule, the width of the pins of the hard macros 10A-10D is the minimum line width "c", and the oblique wiring connected to the pins p of the hard macro 10 is also in the minimum line width "c". It is assumed in this case that the layout pitch of the pins P along the width directions of the peripheral edges 10a, 10b is "a+c", and the layout pitch of the pins P along the perpendicular direction of the peripheral edges 10a, 10b is "$2^{1/2}a/2$".

It is thus found that an oblique pitch d of the pins P, which is set in accordance with both of the layout pitches described above, satisfies a following expression based on the Pythagorean theorem.

$$d \geq \{(a+c)^2 + a^2/2\}^{1/2}$$

The oblique pitch d means the layout pitch of the pins P in the direction where the same corners J of the pins P are connected.

Accordingly, when the pins P are arranged with the oblique pitch d that satisfies the expression "$d \geq \{(a+c)^2+a^2/2\}^{1/2}$", the oblique wirings N of the minimum line width "c". arranged with the minimum space "a" based on the design rule can be directly connected to the pins P which are arranged with the minimum space and minimum line width due to the design rule in the vicinity of the peripheral edges 10a, 10b of the hard macro main body 10.

The present invention has been described in detail by referring to the most preferred embodiments. However, various combinations and modifications of the components are possible without departing from the sprit and the broad scope of the appended claims.

What is claimed is:

1. A semiconductor integrated circuit, comprising a hard macro, a plurality of logic cells and a plurality of wirings, wherein:
   said hard macro includes a hard macro main body, and a plurality of pins connected to said hard macro main body;
   each of said plurality of wirings is connected to one of said plurality of pins and to one of said plurality of logic cells;
   said plurality of pins include at least three first-type pins and at least three second-type pins;
   said first-type pins, each of which is adjacent to one of said first-type pins, are arranged along a first direction;
   said second-type pins, each of which is adjacent to one of said second-type pins, are arranged along a second direction;
   said first direction is oblique to said second direction on a plane;
   wherein:
   said plurality of wirings include first-type wirings and second-type wirings;
   each of said first-type wirings is arranged along a third direction;
   each of said second-type wirings is arranged along a fourth direction;
   said third direction is oblique to said fourth direction on the plane;
   each of said first-type wirings is connected to one of said first-type pins; and
   each of said second-type wirings is connected to one of said second-type pins.

2. The semiconductor integrated circuit of claim 1, wherein:
   said third direction is at an angle of 45 degrees relative to said fourth direction.

3. The semiconductor integrated circuit of claim 1, wherein:
   said first direction is oblique to peripheral edges of said hard macro main body.

4. The semiconductor integrated circuit of claim 3, wherein:
   said second direction is oblique to said peripheral edges of said hard macro main body.

5. The semiconductor integrated circuit of claim 1, wherein:
   said first-type pins are provided in a vicinity of a first peripheral edge of said hard macro main body;
   said second-type pins are provided in a vicinity of a second peripheral edge of said hard macro main body; and
   said first peripheral edge is opposed to said second peripheral edge.

6. The semiconductor integrated circuit of claim 1, wherein:
   a first peripheral edge of said hard macro main body is opposed to a second peripheral edge of said hard macro main body;
   said first-type pins include pins provided in a vicinity of one-end side of said first peripheral edge and other pins provided in a vicinity of an other-end side of said second peripheral edge; and
   said second-type pins include pins provided in a vicinity of an other-end side of said first peripheral edge and other pins provided in a vicinity of one-end side of said second peripheral edge.

7. The semiconductor integrated circuit of claim 6, wherein:
   said first direction is along said first peripheral edge.

* * * * *

UNITED STATES PATENT AND TRADEMARK OFFICE
CERTIFICATE OF CORRECTION

PATENT NO. : 7,636,906 B2  Page 1 of 1
APPLICATION NO. : 11/521490
DATED : December 22, 2009
INVENTOR(S) : Tsutomu Kobayashi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 343 days.

Signed and Sealed this

Ninth Day of November, 2010

David J. Kappos
*Director of the United States Patent and Trademark Office*